United States Patent
Shimomura (10) Patent No.: US 6,340,557 B1
(45) Date of Patent: Jan. 22, 2002

(54) PATTERN FORMATION METHOD (75) Inventor: Koji Shimomura, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/160,329

(22) Filed: Sep. 25, 1998

(30) Foreign Application Priority Data

Apr. 8, 1998 (JP) .......................................... 10-095677

(51) Int. Cl.[7] .................................................. G03C 5/00
(52) U.S. Cl. ........................ 430/316; 430/313; 430/323
(58) Field of Search ................................ 430/314, 323, 430/324, 325, 326, 512, 313, 316; 216/49

(56) References Cited

U.S. PATENT DOCUMENTS

| | | | | |
|---|---|---|---|---|
| 4,835,089 A | * | 5/1989 | Iwayanagi et al. | 430/323 |
| 5,308,742 A | * | 5/1994 | Ta | 430/313 |
| 5,378,309 A | * | 1/1995 | Rabinzohn | 156/643 |
| 5,635,335 A | * | 6/1997 | Bae et al. | 430/312 |
| 5,733,712 A | * | 3/1998 | Tanaka et al. | 430/314 |
| 5,736,296 A | * | 4/1998 | Sato et al. | 430/270.1 |
| 5,922,516 A | * | 7/1999 | Yu et al. | 430/314 |
| 6,080,678 A | * | 6/2000 | Yim | 438/725 |

FOREIGN PATENT DOCUMENTS

| | | |
|---|---|---|
| JP | 10-55072 | 2/1998 |
| JP | 10-97074 | 4/1998 |
| JP | 10-199864 | 7/1998 |
| JP | 10-213904 | 8/1998 |

* cited by examiner

*Primary Examiner*—Mark F. Huff
*Assistant Examiner*—Saleha R. Mohamedulla
(74) *Attorney, Agent, or Firm*—Eric J. Robinson; Nixon Peabody LLP (57) ABSTRACT

After depositing an anti-reflection coating of an organic material for absorbing an energy beam on an etching target film formed on a semiconductor substrate, a photosensitive film of a photosensitive material including a sulfonyl compound is deposited on the anti-reflection coating. After selectively irradiating the photosensitive film with an energy beam, an exposed or unexposed portion of the photosensitive film is removed, thereby forming a patterned photosensitive film. By using the patterned photosensitive film as a mask, the etching target film is dry etched. Thus, a pattern of the etching target film is formed.

5 Claims, 5 Drawing Sheets

PATTERN FORMATION METHOD

BACKGROUND OF THE INVENTION

The present invention relates to a pattern formation method, and more particularly, it relates to a method of forming a pattern out of an etching target film formed on a semiconductor substrate by conducting dry etching on the etching target film by using, as a mask, a patterned photosensitive film formed on the etching target film with an anti-reflection coating of an organic material disposed therebetween.

In accordance with downsizing of a system using complicated semiconductor integrated circuits, it has become very difficult to transfer a complicated circuit onto a small chip by pattern lithography using a patterned photosensitive film as a mask. This is for the following reason: As the wavelength of an energy beam irradiating an etching target film is shortened, the reflectance of the energy beam is increased. Therefore, the energy beam is affected by an irregular step shape of the photosensitive film so as to be reflected in irregular directions after passing through the photosensitive film. As a result, an unnecessary portion (i.e., a portion that should not be irradiated with the energy beam) is exposed in the photosensitive film. This leads to a large number of artificial defects and dimensional variation in a pattern formed by the lithography.

As a countermeasure, it is proposed that an anti-reflection coating for absorbing the energy beam is formed below the photosensitive film so as to prevent the energy beam from being reflected in the irregular directions after passing through the photosensitive film.

Now, a conventional pattern formation method using an anti-reflection coating will be described with reference to FIGS. 4(a) and 4(b).

Figure 4A:
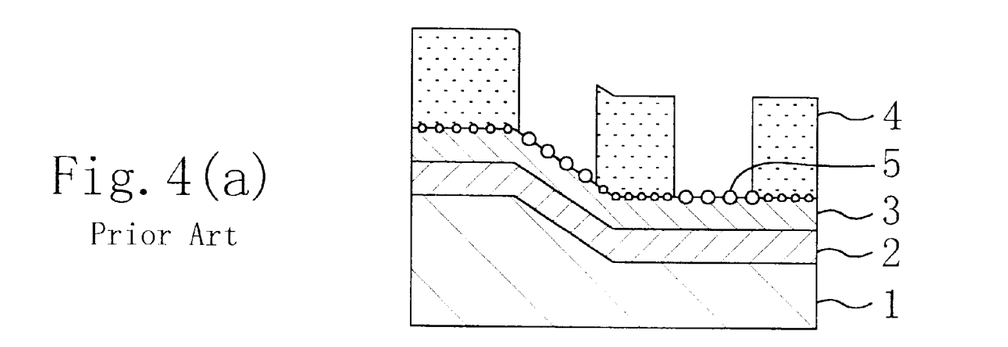
FIGS. 4(a) and 4(b) are sectional views for illustrating procedures and problems in a conventional pattern formation method.

As is shown in FIG. 4(a), an anti-reflection coating 3 of an organic material for absorbing an energy beam is deposited on an etching target film 2 formed on a semiconductor substrate 1, and a photosensitive film is then deposited on the anti-reflection coating 3. Next, the photosensitive film is irradiated with an energy beam through a mask, and an exposed or unexposed portion of the photosensitive film is removed by using a developer, thereby forming a patterned photosensitive film 4 out of the exposed or unexposed portion. Subsequently, the anti-reflection coating 3 is dry etched by using the patterned photosensitive film 4 as a mask, thereby removing an area of the anti-reflection coating 3 corresponding to an opening of the patterned photosensitive film 4.

Figure 4B:
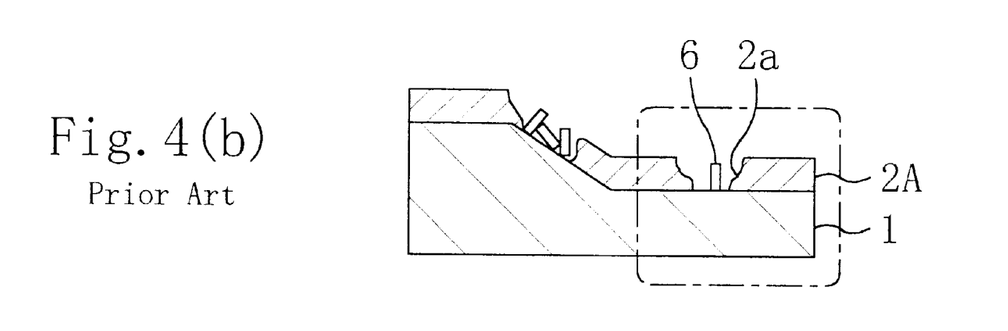

Next, as is shown in FIG. 4(b), the etching target film 2 is dry etched by using the patterned photosensitive film 4 as a mask, and the anti-reflection coating 3 and the photosensitive film 4 are then removed. In this manner, a pattern 2A of the etching target film 2 is formed on the semiconductor substrate 1.

When the pattern 2A is formed in the aforementioned manner, the energy beam having passed through the photosensitive film 4 is absorbed by the anti-reflection coating 3 disposed between the etching target film 2 and the patterned photosensitive film 4. Accordingly, even when the photosensitive film 4 has an irregular step shape, the photosensitive film 4 can be prevented from being exposed to irregularly reflected light. As a result, the pattern 2A of the etching target film 2 can be dimensionally accurately formed.

However, a reaction product 5 is generated on an interface between the anti-reflection coating 3 and the photosensitive film 4 as is shown in FIG. 4(a), so that the reaction product 5 remains on the etching target film 2 after removing the anti-reflection coating 3 and photosensitive film 4.

Thereafter, in the dry etching of the etching target film 2 by using the patterned photosensitive film 4 as a mask, the reaction product 5 remaining on the etching target film 2 serves as a mask. Accordingly, as is shown in FIG. 4(b), a residue 6 of the etching target film 2 can be disadvantageously formed in an area to be etched (i.e., a space area) in the etching target film 2 or a pattern wall 2a of the etching target film 2 required to be vertical can be formed in an irregular shape. In particular, the residue 6 derived from the reaction product 5 has a very small size of 0.1 $\mu$m or less, and is a specific residue basically different from a residue formed due to insufficient conditions for the dry etching of the etching target film 2 (for example, a residue having a size of 0.2 $\mu$m or more).

Also, the residue 6 is generated uniformly without being affected by the aperture ratio of the pattern of the photosensitive film 4, namely, regardless of the density of the pattern. Accordingly, the residue 6 is formed also in a space between patterns formed at a high density.

Therefore, a method of removing the reaction product 6 generated on the interface between the anti-reflection coating 3 and the photosensitive film 4 together with the anti-reflection coating through the dry etching of the anti-reflection coating 3 is considered, but this method is not effective as a method of forming a pattern of the etching target film for the following reason: In the dry etching of the anti-reflection coating 3 by using the patterned photosensitive film 4 as a mask, a larger part of the anti-reflection coating 3 is preferably removed while a smaller part of the patterned photosensitive film 4 is preferably removed. However, both the anti-reflection coating 3 and the photosensitive film 4 are made from organic materials, and hence, they have very similar dry etching characteristics (such as an etching rate). Accordingly, when the anti-reflection coating 3 is dry etched under conditions where the patterned photosensitive film 4 can be less removed through the dry etching, large parts of the reaction product 5 and the anti-reflection coating 3 remain on the etching target film 2. In contrast, when the anti-reflection coating 3 is dry etched under conditions where the reaction product 5 cannot remain, the patterned photosensitive film 4 is also removed through the dry etching and cannot work as a mask. In addition, even when the dry etching is actually conducted so as to remove the reaction product 5 without considering the masking function of the photosensitive film 4 (for example, by elongating the etching time or the like), the residue 6 cannot be reduced.

Furthermore, when a dry etching process in which a deposition is formed on the wall of the anti-reflection coating 3 is adopted so as to improve the dimensional controllability on the anti-reflection coating 3, the deposition peeled off from the wall of the anti-reflection coating 3 can be easily adhered onto the etching target film 2. Therefore, the deposition works as a mask, resulting in forming the residue 6 of the etching target film 2.

When the residue 6 of the etching target film 2 remains on the semiconductor substrate 1 or when the pattern wall 2a of the etching target film 2 is formed in an irregular shape, the following problems are caused:

In the case where the etching target film 2 is made from a conductive material such as polysilicon, wire patterns formed in the same conductive layer in a resultant semiconductor integrated circuit device can be electrically connected with each other through the conductive residue 6. Alternatively, a conductive layer formed on the semiconductor substrate 1 can be electrically connected through the conductive residue 6 with a wire pattern formed on the conductive layer with an interlayer insulating film sandwiched therebetween. Accordingly, a leakage current flows between the wire patterns or between the conductive layer and the wire pattern. As a result, the semiconductor integrated circuit device can be disadvantageously degraded in its characteristic or yield.

Figure 5:
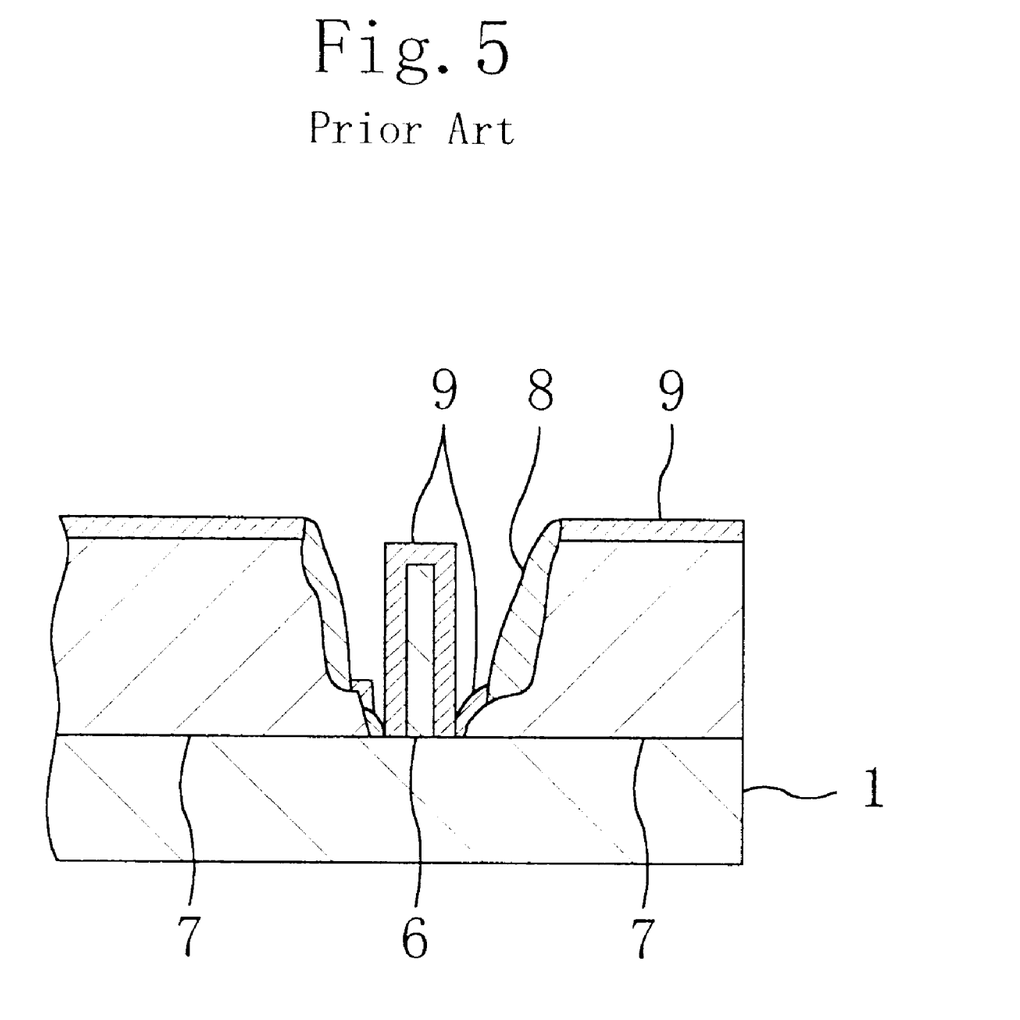
FIG. 5 is an enlarged sectional view for illustrating problems in the conventional pattern formation method.

FIG. 5 is an enlarged view of an area surrounded with a dashed line in FIG. 4(b). As is shown in FIG. 5, a gate electrode 7 of a polysilicon film corresponding to the etching target film 2 is formed on the semiconductor substrate 1, and the residue 6 of the polysilicon film remains in a region between the gate electrodes 7 in the semiconductor substrate 1, namely, in a source/drain region. Also, a sidewall 8 of an insulating material such as $Si_3N_4$, TEOS and HTO is formed on the side face of the gate electrode 7, and the surfaces of the gate electrode 7 and the source/drain region are silicided with $TiSi_2$ or the like to be covered with a silicide layer 9. However, since the shape of the side face of the gate electrode 7 is irregular, the gate electrode 7 is bared on the sidewall 8, and the silicide layer 9 is formed not only on the bared portion of the gate electrode 7 on the sidewall 8 but also on the surface of the residue 6 of polysilicon.

Accordingly, the gate electrode 7 and the source/drain region are electrically connected with each other through the silicide layer 9 on the gate electrode 7 or on the residue 6. Thus, an abnormal leakage current unavoidably flows between the gate electrode 7 and the source/drain region, resulting in degrading the device characteristic.

SUMMARY OF THE INVENTION

In view of the aforementioned conventional problems, the object of the invention is, while using an anti-reflection coating of an organic material disposed between an etching target film and a photosensitive film, preventing generation of a reaction product on the anti-reflection coating, so as to reduce the number of residues of the etching target film.

As a result of examination on the cause of generating the reaction product on the interface between the anti-reflection coating and the photosensitive film, the present inventors have found that the reaction product is generated in accordance with a mechanism described below and that a sulfonyl compound has a function to suppress the generation of the reaction product.

On the interface between the photosensitive film and the anti-reflection coating of an organic material, an aromatic radical is generated from a photosensitive material included in the photosensitive film through the exposure to an energy beam. Then, the radical causes a chain reaction with an aromatic compound included in the anti-reflection coating, resulting in generating a high molecular aromatic compound (that is, the reaction product 5) having high etching resistance. As a result, residues remain in a space portion of a pattern formed after the dry etching of the etching target film.

In particular, when the photosensitive film contains an acid generator including, for example, onium salt, a larger amount of the aromatic reaction product is generated on the interface between the anti-reflection coating and the photosensitive film through the irradiation with the energy beam (namely, the aromatic reaction product is generated also in the photosensitive film). Therefore, the number of residues is increased.

However, when a sulfonyl compound is added, an aryl radical is generated as a side product through the exposure to the energy beam. In this case, when the aromatic radical generates the high molecular aromatic compound (the reaction product 5) through the radical chain reaction, the aryl radical causes a coupling reaction, resulting in preventing the chain reaction of the aromatic radical. In other words, the aryl radical works as a reaction inhibitor against the chain reaction of the aromatic radical. Accordingly, the generation of the high molecular aromatic compound (the reaction product 5) having high etching resistance can be prevented by adding the sulfonyl compound. Thus, the pattern formed after the dry etching of the etching target film can be free from the residues.

On the basis of the aforementioned findings, according to the present invention, the sulfonyl compound is included in the photosensitive film, so that the aromatic reaction product can be prevented from being generated on the interface between the anti-reflection coating and the photosensitive film.

Specifically, the pattern formation method of this invention comprises a first step of depositing an anti-reflection coating of an organic material for absorbing an energy beam on an etching target film formed on a semiconductor substrate; a second step of depositing a photosensitive film on the anti-reflection coating; a third step of forming a patterned photosensitive film by irradiating the photosensitive film with an energy beam and selectively removing an exposed or unexposed portion of the photosensitive film; and a fourth step of forming a pattern out of the etching target film by conducting dry etching on the etching target film by using the patterned photosensitive film as a mask, wherein the photosensitive film is made from a photosensitive material including a sulfonyl compound.

In the pattern formation method of this invention, since the photosensitive film includes the sulfonyl compound, an acid including aryl is generated from the sulfonyl compound through the irradiation of the photosensitive film with the energy beam, so that the generated acid including aryl can prevent the radical reaction on the interface between the anti-reflection coating and the photosensitive film. Accordingly, the aromatic reaction product can be prevented from being generated on the interface between the anti-reflection coating and the photosensitive film. Therefore, when the pattern is formed out of the etching target film by conducting the dry etching on the etching target film by using the patterned photosensitive film and anti-reflection coating as masks, the number of residues of the etching target film formed on the semiconductor substrate can be decreased.

In the case where the etching target film is made from a conductive film, wire patterns formed in the same conductive layer can be electrically connected with each other or a conductive layer formed on a semiconductor substrate can be electrically connected with a wire pattern through the conductive residue in a semiconductor integrated circuit device. In such a case, a leakage current can flow between the wire patterns or between the conductive layer and the wire pattern, resulting in degrading the characteristic of the semiconductor integrated circuit device. However, when the pattern formation method of this invention is adopted, such characteristic degradation can be definitely avoided.

In the pattern formation method of this invention, the sulfonyl compound is preferably used as an acid generator.

In this manner, even when the photosensitive film does not include an acid generator for generating an acid, the sulfonyl compound included in the photosensitive film can generate an acid. Therefore, the reaction product generated by the acid generator, and furthermore, the number of residues can be reduced.

In the pattern formation method of this invention, the photosensitive film can include an alkali refractory resin and an acid generator for generating an acid, such as onium salt.

In this manner, since the photosensitive film includes the sulfonyl compound and the sulfonyl compound prevent the generation of the reaction product from the acid generator such as onium salt, the increase in the number of residues derived from the reaction product can be suppressed.

In the pattern formation method of this invention, the photosensitive film preferably includes an alkali refractory resin and does not include an acid generator for generating an acid.

In the pattern formation method of this invention, the fourth step preferably includes a step of patterning the anti-reflection coating through dry etching of the anti-reflection coating by using the patterned photosensitive film as a mask and by using a sulfur etching gas, and conducting the dry etching of the etching target film by using the patterned photosensitive film and anti-reflection film as masks, whereby forming the pattern out of the etching target film.

In this manner, the selectivity to the etching target film can be improved, and the dimensional variation of the pattern of the etching target film can be reduced. In addition, the number of residues formed out of the etching target film on the semiconductor substrate can be decreased.

DETAILED DESCRIPTION OF THE INVENTION

EMBODIMENT 1

A pattern formation method according to a first embodiment of the invention will now be described with reference to FIGS. 1(a) through 1(d) and 2(a) through 2(c).

Figure 1A:
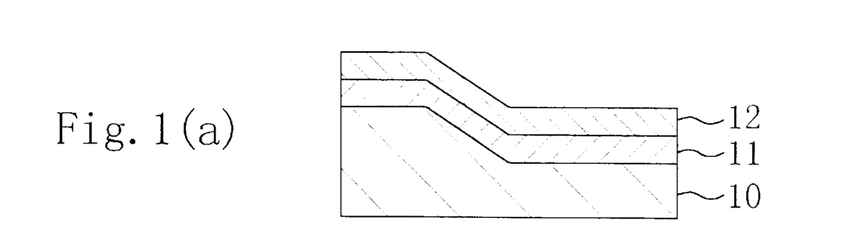
FIGS. 1(a) through 1(d) are sectional views for showing procedures in a pattern formation method according to a first embodiment of the invention.

First, as is shown in FIG. 1(a), on a semiconductor substrate 10 of silicon having a step on its surface, an etching target film 11 of, for example, a polysilicon film is deposited with a silicon oxide film serving as an etching stopper sandwiched therebetween. Then, an anti-reflection coating 12 of an organic material for absorbing an energy beam such as light, an electron beam and X-ray is deposited on the etching target film 11.

Figure 1B:
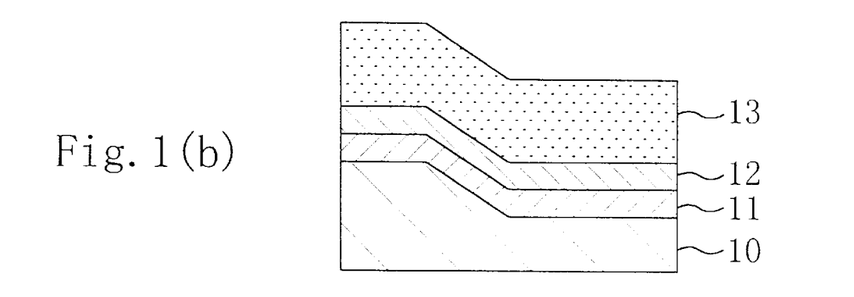

Next, as is shown in FIG. 1(b), the anti-reflection coating 12 is coated with a photosensitive material (a chemically amplified resist material) including a polyvinyl phenol derivative, that is, an alkali refractory resin serving as a base polymer, an acid generator for generating an acid (such as onium salt), a sulfonyl compound as an additive, and a solvent. Thus, a photosensitive film 13 including the sulfonyl compound is deposited on the anti-reflection coating 12.

Figure 1C:
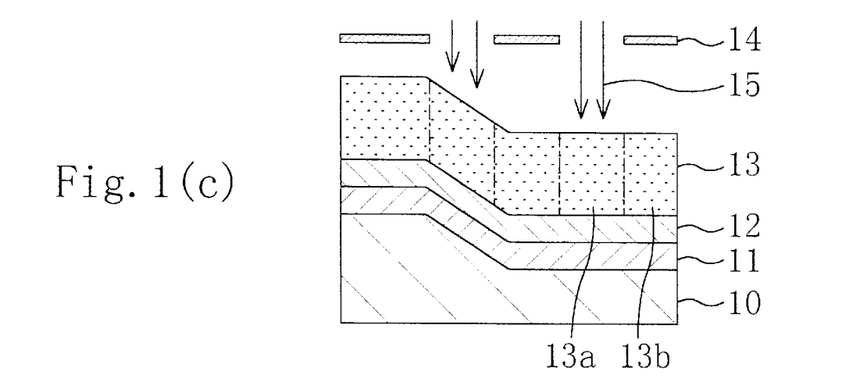
Figure 1D:
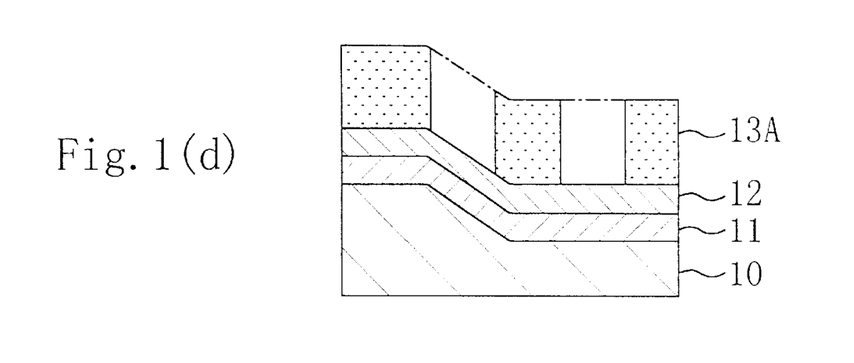

Then, as is shown in FIG. 1(c), the photosensitive film 13 is irradiated with an energy beam 15 such as light, an electron beam and X-ray through a mask 14, and an exposed portion 13a of the photosensitive film 13 is dissolved in a developer. Thus, a patterned photosensitive film 13A consisting of an unexposed portion 13b of the photosensitive film 13 is formed as is shown in FIG. 1(d). Alternatively, the unexposed portion 13b of the photosensitive film 13 can be dissolved in a developer, so that the patterned photosensitive film consisting of the exposed portion 13a of the photosensitive film 13 can be formed.

Figure 2A:
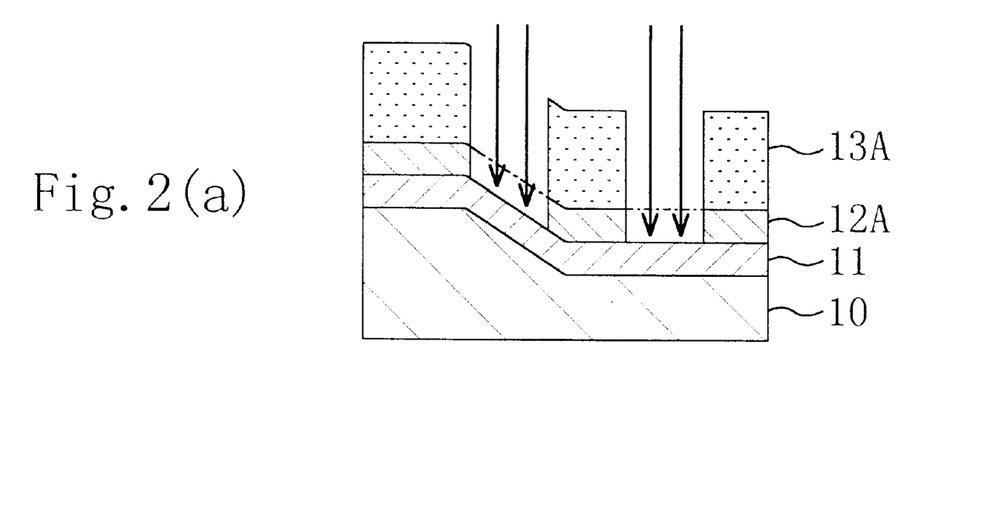
FIGS. 2(a) through 2(c) are sectional views for showing other procedures in the pattern formation method of the first embodiment.

Subsequently, as is shown in FIG. 2(a), the anti-reflection coating 12 is dry etched by using the patterned photosensitive film 13A as a mask, so as to transfer the pattern shape of the patterned photosensitive film 13A onto the anti-reflection coating 12. Thus, a patterned anti-reflection coating 12A is formed.

Figure 2B:
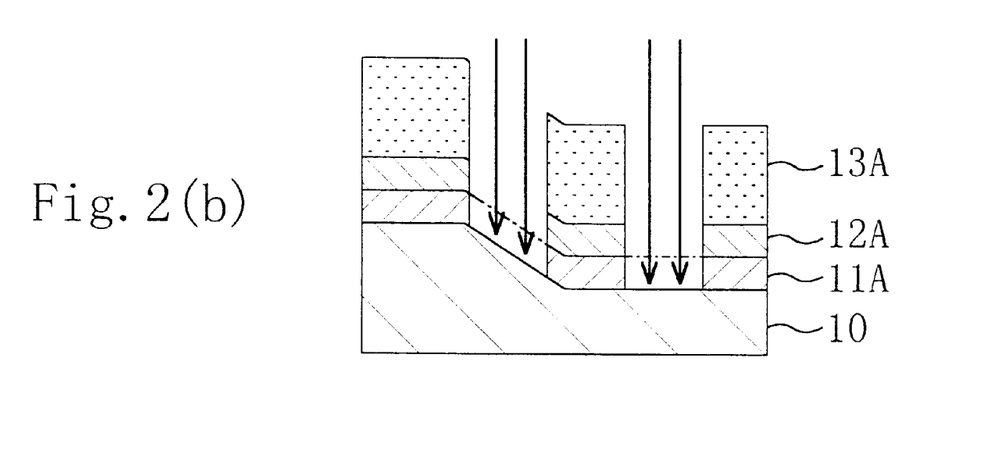

Next, as is shown in FIG. 2(b), the etching target film 11 is dry etched by using the patterned photosensitive film 13A and the patterned anti-reflection coating 12A as masks, so as to transfer the pattern shape of the patterned photosensitive film 13A onto the etching target film 11. Thus, a pattern 11A is formed out of the etching target film 11.

Figure 2C:
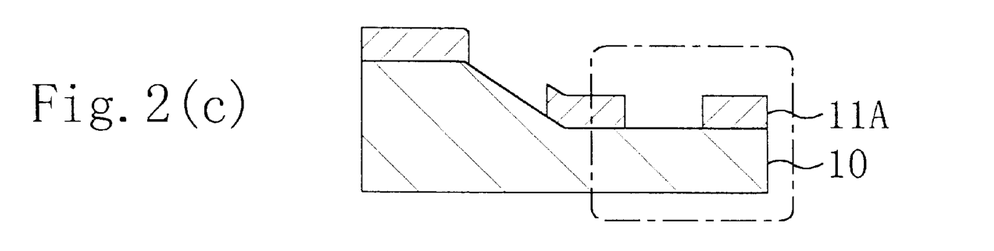

Then, as is shown in FIG. 2(c), the patterned photosensitive film 13A and the patterned anti-reflection film 12A on the semiconductor substrate 10 are removed. In this manner, the pattern 11A of the etching target film 11 can be formed on the semiconductor substrate 10.

According to the first embodiment, the sulfonyl compound is added to the photosensitive material, so as to generate an aryl radical as a side product through the irradiation with the energy beam. In this case, when an aromatic radical generates a high molecular aromatic compound (that is, the reaction product 5) through a radical chain reaction, the aryl radical causes a coupling reaction, thereby preventing the radical chain reaction of the aromatic radical. In other words, the aryl radical works as a reaction inhibitor against the chain reaction of the aromatic radical.

Accordingly, the generation of the high molecular aromatic compound (the reaction product 5) having high etching resistance can be prevented by adding the sulfonyl compound. Therefore, the pattern formed after the dry etching of the etching target film can be free from residues.

Therefore, when the pattern 11A of the etching target film 11 is formed through the dry etching of the etching target film 11 by using the patterned photosensitive film 13A and the patterned anti-reflection coating 12A as the masks, the number of residues of the etching target film 11 remaining on the semiconductor substrate 10 can be decreased.

Figure 3:
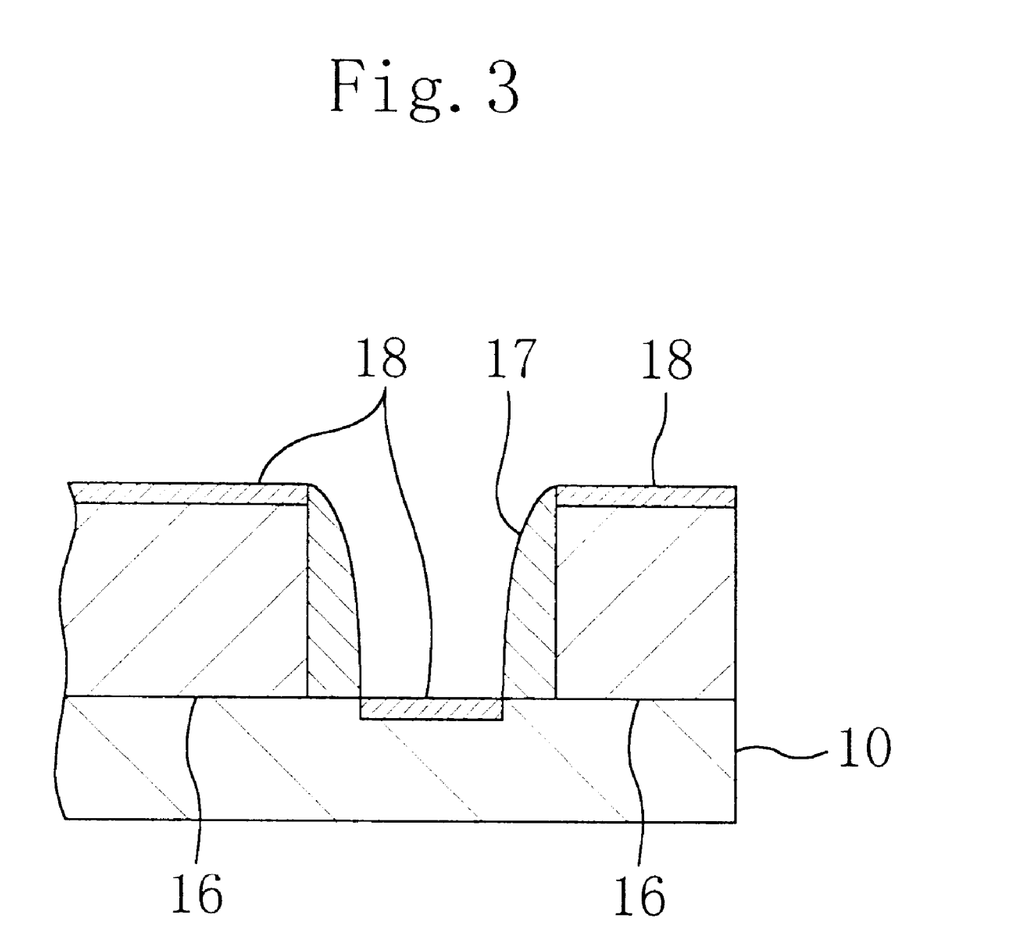
FIG. 3 is an enlarged sectional view for illustrating an effect of the pattern formation method of the first embodiment.

FIG. 3 is an enlarged view of an area surrounded with a dashed line in FIG. 2(c). As is shown in FIG. 3, a gate electrode 16 is formed out of the polysilicon film corresponding to the etching target film 11 on the semiconductor substrate 10, and a sidewall 17 of an insulating material such as $Si_3N_4$, TEOS and HTO is formed on the side face of the gate electrode 16. Also, the surface of the gate electrode 16 and the surface of a source/drain region formed in the semiconductor substrate 10 between the gate electrodes 16 are silicided with $TiSi_2$ or the like so as to be covered with a silicide layer 18. On the other hand, there remains no residue on the source/drain region, and the side face of the gate electrode 16 is formed in a uniform shape so that the gate electrode 16 cannot be bared on the sidewall 17, and hence, the silicide layer 18 is not formed on the side face of the gate electrode 16.

Therefore, the gate electrode 16 and the source/drain region are not electrically connected with each other through the silicide layer formed on the gate electrode 16 or on the residue. As a result, an abnormal leakage current can be prevented from flowing between the gate electrode 16 and the source/drain region, and hence, the degradation in the device characteristic can be avoided.

The sulfonyl compound described in the first embodiment includes a sulfone compound and a sulfonate compound, and examples of the sulfone compound include β-ketone sulfone, β-sulfonyl sulfone, an α-diazo compound and the like. Compounds represented by Chemical Formulas 1 through 5 described below are also included in the sulfone compound. Examples of the sulfonate compound include alkylsulfonate, holoalkylsulfonate and the like. A compound represented by Chemical Formula 6 described below is also included in the sulfonate compound. Also, the sulfonate compound herein includes an imide compound belonging to sulfonates. Examples of such an imide compound include N-(camphorsulfonyloxy)naphthalimide and N-(pentafluorophenylsulfonyloxy)naphthalimide.

Now, specific methods of forming the anti-reflection coating 12 and the photosensitive film 13 and experiments on the number of residues will be described.

SPECIFIC EXAMPLE 1

First, on a semiconductor substrate 10 of silicon with a size of 200 mm, an etching target film 11 of polysilicon is deposited with a silicon oxide film serving as an etching stopper interposed therebetween. Then, the etching target film 11 is coated with an organic material of a polysulfone copolymer dissolved in a solvent of cyclohexane, thereby forming an anti-reflection coating 12 with a thickness of 150 nm.

Next, the anti-reflection coating 12 is coated with a photosensitive material (chemically amplified resist material) including a polyvinyl phenol derivative, that is, an alkali refractory resin serving as a base polymer, triphenyl-sulfonium acetate designated as onium salt serving as an acid generator for generating an acid, the sulfonyl compound represented by Chemical Formula 1 below at a content of 1 wt % of the base polymer, and propylene glycol monoethyl ether acetate serving as a solvent. In this manner, a photosensitive film 13 with a thickness of 700 nm is formed. The compound represented by Chemical Formula 1 below is bis(cyclohexylsulfonyl) diazomethane.
Chemical Formula 1:

Then, the photosensitive film 13 is irradiated with a KrF excimer laser through a mask 14, and an exposed portion 13a of the photosensitive film 13 is dissolved in a developer including a 2.38% aqueous solution of tetramethylammonium hydroxide (hereinafter referred to as TMAH). In this manner, a patterned photosensitive film 13A is formed out of an unexposed portion 13b of the photosensitive film 13.

Next, the anti-reflection coating 12 is dry etched by using an etching gas including a mixture of sulfur disulfide ($SO_2$) and oxygen ($O_2$) by using the patterned photosensitive film 13A as a mask, thereby forming a patterned anti-reflection coating 12A.

Subsequently, the etching target film 11 of polysilicon is dry etched by using an etching gas including a mixture of hydrogen bromide (HBr) and oxygen ($O_2$) by using the patterned photosensitive film 13A and the patterned anti-reflection coating 12A as masks, thereby forming a pattern 11A out of the etching target film 11. In this case, as the pattern 11A, a wire pattern with a design rule of 0.25 $\mu$m is formed with its density varied, and the pattern occupation ratio is approximately 5%.

At this point, the number of residues with a size up to approximately 0.1 $\mu$m is found to be approximately 6000 per wafer.

As a first reference example, an anti-reflection coating similar to that of the first specific example is formed on an etching target film of polysilicon deposited on a semiconductor substrate, a photosensitive film including the same materials as that of the first specific example except for the sulfonyl compound of Chemical Formula 1 is deposited on the anti-reflection coating, and a pattern is formed out of the etching target film under the same condition as that in the first specific example. In the first reference example, the number of residues is approximately 10000 per wafer.

As is obvious from the comparison between the first specific example and the first reference example, the number of residues can be reduced by approximately 40% in the first specific example. As a result, the occurrence of a leakage current between wire patterns or between a conductive layer and a wire pattern can be reduced by approximately 40% in a semiconductor integrated circuit device obtained by using the first specific example.

Also, as a second reference example, a photosensitive film the same as that of the first specific example is deposited on an etching target film of polysilicon deposited on a semiconductor substrate without forming an anti-reflection coating therebetween, and a pattern is formed out of the etching target film under the same condition as that in the first specific example. The number of residues is approximately 500 per wafer.

As an organic material for forming the anti-reflection coating, materials such as DUV-18, CD9 and CD11 (all manufactured by Brewer Science), AR2 (manufactured by Shipley Company), SWK-EX2 (manufactured by Tokyo Ohka Kogyo Co., Ltd.) and KrF-2A (manufactured by Clariant) are evaluated in the same manner as in the first specific example. The numbers of residues obtained by using these materials are much larger than that obtained in the second reference example. This reveals that the increase in number of residues cannot be avoided when the anti-reflection coating is disposed between the etching target film and the photosensitive film as compared with the case where the anti-reflection coating is omitted.

However, when the anti-reflection coating is disposed between the etching target film and the photosensitive film, the number of residues can be largely decreased by using the photosensitive film including the sulfonyl compound of Chemical Formula 1 as in the first specific example.

SPECIFIC EXAMPLE 2

As a second specific example, another kind of sulfonyl compound as an additive to the photosensitive material will be described. Specifically, the sulfonyl compound represented by Chemical Formula 2 below is added at a content of 3 wt % of the base polymer in the second specific example. As a result, the number of residues is approximately 8400 per wafer, which is smaller by approximately 16% as compared with the number attained in the first reference example. The compound represented by Chemical Formula 2 is biscyclohexyl sulfonylmethane.

Chemical Formula 2:

SPECIFIC EXAMPLE 3

As a third specific example, still another kind of sulfonyl compound as an additive to the photosensitive material will be described. Specifically, the sulfonyl compound represented by Chemical Formula 3 below is added at a content of 3 wt % of the base polymer in the third specific example. As a result, the number of residues is approximately 6000 per wafer, which is smaller by approximately 40% as compared with the number attained in the first reference example. The compound represented by Chemical Formula 3 is bis(4-methylphenylsufonyl)diazomethane.

Chemical Formula 3:

SPECIFIC EXAMPLE 4

As a fourth specific example, still another kind of sulfonyl compound as an additive to the photosensitive material will be described. Specifically, the sulfonyl compound represented by Chemical Formula 4 below is added at a content of 1 wt % of the base polymer in the fourth specific example. As a result, the number of residues is approximately 4600 per wafer, which is smaller by approximately 64% as compared with L-the number attained in the first reference example. The compound represented by Chemical Formula 4 is bis(4-chlorophenylsufonyl)diazomethane.

Chemical Formula 4:

SPECIFIC EXAMPLE 5

As a fifth specific example, still another kind of sulfonyl compound as an additive to the photosensitive material will be described. Specifically, the sulfonyl compound represented by Chemical Formula 5 below is added at a content of 1 wt % of the base polymer in the fifth specific example. As a result, the number of residues is approximately 6000 per wafer, which is smaller by approximately 40% as compared with the number attained in the first reference example.

Chemical Formula 5:

SPECIFIC EXAMPLE 6

As a sixth specific example, still another kind of sulfonyl compound as an additive to the photosensitive material will be described. Specifically, the sulfonyl compound represented by Chemical Formula 6 below is added at a content of 1 wt % of the base polymer in the sixth specific example. As a result, the number of residues is approximately 4500 per wafer, which is smaller by approximately 55% as compared with the number attained in the first reference example. The compound represented by Chemical Formula 6 is pyrogallol tris(methanesulfonate).

Chemical Formula 6:

On the basis of the first through sixth specific examples, it is confirmed that the number of residues can be largely decreased by adding any of various sulfonyl compounds to the photosensitive material. Therefore, it is obvious that the number of residues can be largely decreased by adding another sulfonyl compound not described in the first through sixth specific examples.

Now, as an etching gas used in the dry etching of the anti-reflection coating 12 by using the patterned photosensitive film 13A as a mask, the following three kinds of gases will be compared: An etching gas including a mixture of a chlorine ($Cl_2$) gas and an oxygen ($O_2$) gas (hereinafter referred to as a chlorine etching gas); an etching gas including a mixture of nitrogen ($N_2$) gas and an oxygen ($O_2$) gas (hereinafter referred to as a nitrogen etching gas); and an etching gas including a mixture of a sulfur disulfide ($SO_2$) gas and an oxygen ($O_2$) gas (hereinafter referred to as a sulfur etching gas).

Chlorine Etching Gas:

The chlorine etching gas has higher ionicity, namely, a higher sputtering yield as compared with the sulfur etching gas. Therefore, in the dry etching of the anti-reflection coating 12, a deposition generated by the etching gas is less likely to be adhered onto the side face of the anti-reflection coating 12 and then peeled off to be adhered onto the upper face of the anti-reflection coating 12. In addition, the chlorine etching gas is good at removing a reaction product generated on the interface between the anti-reflection coating and the photosensitive film through the etching. Accordingly, the number of residues of the etching target film derived from the deposition or the reaction product working as a mask can be reduced.

By using the chlorine etching gas where a flow ratio of the oxygen gas and the like are set in the same manner as in the first specific example, the dry etching is conducted on the anti-reflection coating 12 by using the patterned photosensitive film 13A as a mask. Then, the number of residues is measured in the same manner as in the first specific example.

The number is found to be approximately 5000 per wafer, which is smaller than that in the first specific example.

However, in using the chlorine etching gas, not only the anti-reflection coating 12 is dry etched but also the etching target film 11 of polysilicon is successively etched. This is because reactive dry etching for generating $SiCl_4$ through a reaction between silicon (Si) included in polysilicon of the etching target film 11 and chlorine ($Cl_2$) is proceeded. Accordingly, in the dry etching of the etching target film 11, over-etching is caused in a portion of the etching target film 11 which has been dry etched by the chlorine etching gas. As a result, the semiconductor substrate 10, which is not to be etched, is disadvantageously etched.

Accordingly, although the number of residues can be decreased by using the chlorine etching gas as compared with the case where the sulfur etching gas is used, there arises a problem that the yield of the semiconductor integrated circuit device is degraded because the semiconductor substrate 10 is etched.

Nitrogen Etching Gas:

Also the nitrogen etching gas has higher ionicity, namely, a higher sputtering yield than the sulfur etching gas. Therefore, in the dry etching of the anti-reflection coating 12, a deposition generated by the etching gas is less likely to be adhered onto the side face of the anti-reflection coating 12 and then peeled off to be adhered onto the upper face of the anti-reflection coating 12. In addition, the nitrogen etching gas is good at removing a reaction product generated on the interface between the anti-reflection coating and the photosensitive film through the etching. Accordingly, the number of residues of the etching target film derived from the deposition or the reaction product working as a mask can be reduced.

By using the nitrogen etching gas where a flow ratio of the oxygen gas and the like are set in the same manner as in the first specific example, the dry etching is conducted on the anti-reflection coating 12 by using the patterned photosensitive film 13A as a mask. Then, the number of residues is measured in the same manner as in the first specific example. The number is found to be approximately 5000 per wafer, which is smaller than that in the first specific example. Furthermore, the phenomenon occurring in using the chlorine etching gas that the etching target film 11 of polysilicon is etched cannot be observed.

However, in the dry etching of the anti-reflection coating 12, the patterned photosensitive film 13A is also largely etched, and hence, there arises a problem that the dimension of the patterned anti-reflection coating 12A is largely varied and dispersed. This is because the deposition generated by the etching gas is less adhered to the side faces of the patterned photosensitive film 13A and the anti-reflection coating 12 as compared with the case where the chlorine etching gas is used. In an etching process for forming a line pattern with a design rule of 0.25 μm, when the sulfur etching gas is used, the resultant pattern width is 0.23 μm, which is smaller merely by approximately 0.02 μm than the design rule, and the dimension of the resultant pattern is equally varied in an area at a high density and an area at a low density. In contrast, when the nitrogen etching gas is used, while an isolated pattern has a pattern width of 0.18 μm, the pattern width is 0.20 μm in an area where the line width is equal to a space width. Thus, in using the nitrogen etching gas, the dimension of the resultant pattern is largely varied from the design rule and is largely varied between the area at a high density and the area at a low density.

Accordingly, although the number of residues can be reduced by using the nitrogen gas as compared with the case where the sulfur etching gas is used, the dimension of the pattern 11A of the etching target film 11 is largely varied and dispersed. As a result, there arises a problem that the yield of the semiconductor integrated circuit device is degraded.

Sulfur Etching Gas:

When the sulfur etching gas is used, a larger number of residues of the etching target film 11 derived from a reaction product working as a mask remain on the semiconductor substrate 10 as compared with the case where the chlorine or nitrogen etching gas is used. However, the problem that the semiconductor substrate 10 is etched as caused in using the chlorine etching gas and the problem that the dimension of the pattern 11A of the etching target film 11 is largely varied as caused in using the nitrogen etching gas can be both avoided.

As described in the first embodiment, when the photosensitive material includes the sulfonyl compound, the aromatic reaction product can be prevented from being generated on the interface between the anti-reflection coating 12 and the photosensitive film 13. Therefore, when the pattern 11A is formed out of the etching target film 11, the number of residues of the etching target film 11 remaining on the semiconductor substrate 10 can be reduced.

Accordingly, when the etching target film 11 is dry etched by using the sulfur etching gas and by using the patterned photosensitive film 13A including the sulfonyl compound as a mask, the selectivity to the etching target film 11 can be improved and the dimensional variation of the pattern 11A of the etching target film 11 can be reduced. In addition, the number of residues of the etching target film 11 remaining on the semiconductor substrate 10 can be reduced.

EMBODIMENT 2

A pattern formation method according to a second embodiment will now be described.

In the second embodiment, an anti-reflection coating 12 is coated with a photosensitive material (chemically amplified resist material) including a polyvinyl phenol derivative, that is, an alkali refractory resin serving as a base polymer, a sulfonyl compound and a solvent, thereby depositing a photosensitive film 13 including the sulfonyl compound on the anti-reflection coating 12. Specifically, as compared with the first embodiment, the photosensitive material does not include onium salt serving as an acid generator. Since the onium salt serving as an acid generator is not included in the photosensitive material, the polyvinyl phenol derivative serving as the base polymer in the second embodiment is of a different type from the polyvinyl phenol derivative serving as the base polymer in the first embodiment.

Now, a method of forming the photosensitive film 13 according to the second embodiment and an experiment on the number of residues will be described.

The anti-reflection coating 12 is coated with a photosensitive material (chemically amplified resist material) including a polyvinyl phenol derivative, that is, an alkali refractory resin serving as a base polymer, the sulfonyl compound represented by Chemical Formula 1 at a content of 1 wt % of the base polymer and propylene glycol monoethyl ether acetate, thereby forming the photosensitive film 13. The procedures thereafter are herein omitted because the method of the second embodiment is the same as that of the first embodiment except that the photosensitive material is different as described above.

In a pattern formed by the method of the second embodiment, the number of residues with a size larger than approximately 50 nm is approximately 3000 per wafer.

Since the onium salt for generating the aromatic reaction product on the interface between the anti-reflection coating and the photosensitive film is not included in the photosensitive material, the number of residues can be further smaller than in the first embodiment.

Furthermore, although the photosensitive material does not include the onium salt, the resultant patterned photosensitive film 13A has a good shape.

When any of the sulfonyl compounds of Chemical Formulas 2 through 6 is used as an acid generator in stead of the sulfonyl compound of Chemical Formula 1, a base polymer which allows the sulfonyl compound used together to efficiently generate an acid is preferably selected.

The sulfonyl compound includes a sulfone compound and a sulfonate compound. When the sulfonyl compound is used as an additive as in the first embodiment, one or both of a sulfone compound or a sulfonate compound can be added. Similarly, when the sulfonyl compound is used as an acid generator as in the second embodiment, one or both of a sulfone compound and a sulfonate compound can be used as the acid generator.

In the aforementioned embodiments, the anti-reflection coating 12 alone is dry etched and the etching target film 11 below is not etched in the dry etching procedure of the anti-reflection coating 12. By conducing the dry etching in this manner, if the dimensional variation or increase of residues and foreign matters is caused due to any trouble in the dry etching of the anti-reflection coating 12, the photosensitive film 13 and the anti-reflection coating 12 can be removed and the procedure can be restarted from the state shown in FIG. 1(a). Accordingly, the condition of a wafer characteristic can be thus confirmed between procedures, so that the occurrence of a characteristic failure in the wafer can be previously prevented. On the other hand, it is obviously useful to remove both the anti-reflection coating 12 and the etching target film 11 through one dry etching procedure because the entire process can be thus advantageously shortened.

What is claimed is:

1. A pattern formation method comprising:

depositing an anti-reflection coating of an organic material for absorbing an energy beam on an etching target film formed on a semiconductor substrate;

depositing a photosensitive film on said anti-reflection coating;

forming a patterned photosensitive film by selectively irradiating said photosensitive film with said energy beam and removing an exposed or unexposed portion of said photosensitive film;

forming a patterned anti-reflection coating by conducting dry etching on said anti-reflection coating by using said patterned photosensitive film as a mask and using an etching gas containing sulfur; and forming a pattern out of said etching target film by conducting dry etching on said etching target film by using said patterned photosensitive film as a mask, wherein said anti-reflection coating has a thickness which is uniform such that a top face of said anti-reflection coating longitudinally varies in line with a top face of said etching target film, said photosensitive film is made from a photosensitive material including a sulfonyl compound.

2. The pattern formation method of claim 1, wherein said sulfonyl compound is used as an acid generator.

3. The pattern formation method of claim 1, wherein said photosensitive film contains onium salt as an acid generator.

4. The pattern formation method of claim 1, wherein said sulfonyl compound is bis (cyclohexylsulfonyl) diazomethane.

5. The pattern formation method of claim 1, wherein said energy beam is an excimer laser.

* * * * *